(12) United States Patent
Birleson et al.

(10) Patent No.: US 6,177,964 B1
(45) Date of Patent: Jan. 23, 2001

(54) BROADBAND INTEGRATED TELEVISION TUNER

(75) Inventors: Vince Birleson, West Tawakoni; Albert Taddiken, Farmersville; Ken Clayton, Plano, all of TX (US)

(73) Assignee: Microtune, Inc., Plano, TX (US)

( * ) Notice: Under 35 U.S.C. 154(b), the term of this patent shall be extended for 0 days.

(21) Appl. No.: 08/904,908

(22) Filed: Aug. 1, 1997

(51) Int. Cl.[7] ................................................. H04N 5/44
(52) U.S. Cl. ......................... 348/725; 348/726; 348/731; 455/315; 455/339
(58) Field of Search ............................... 348/725, 731, 348/726; 455/315, 339, 302, 179.1, 260, 316; 358/191.1, 195; 331/2, 16, 39, 41; H04N 5/44

(56) References Cited

U.S. PATENT DOCUMENTS

| | | | |
|---|---|---|---|
| 3,839,676 | 10/1974 | Linnecar | 325/394 |
| 4,162,452 | 7/1979 | Ash | 325/373 |
| 4,176,351 | 11/1979 | DeVita et al. | 343/9 |
| 4,328,531 | 5/1982 | Nagashima et al. | 361/401 |
| 4,340,975 | 7/1982 | Onishi et al. | 455/315 |
| 4,581,643 | * 4/1986 | Carlson | 358/191.1 |
| 4,742,566 | 5/1988 | Nordholt et al. | 455/260 |
| 4,855,835 | 8/1989 | Tobita | 358/195 |
| 5,060,297 | 10/1991 | Ma et al. | 455/302 |
| 5,200,826 | * 4/1993 | Seong | 358/191.1 |
| 5,369,440 | 11/1994 | Sussman | 348/462 |
| 5,428,836 | * 6/1995 | Sanecki | 455/315 |
| 5,737,035 | * 4/1998 | Rotzoll | 348/725 |

FOREIGN PATENT DOCUMENTS 4321565    1/1995   (DE) ............................... H03B/5/12

* cited by examiner

Primary Examiner—Mark R. Powell
Assistant Examiner—Wesner Sajous
(74) Attorney, Agent, or Firm—Fulbright & Jaworski L.L.P.

(57) ABSTRACT

A broadband integrated television receiver for receiving a standard antenna or cable input and outputting an analog composite video signal and composite audio signal is disclosed. The receiver employs an up-conversion mixer and a down-conversion mixer in series to produce an IF signal. An IF filter between the mixers performs coarse channel selection. The down-conversion mixer may be an image rejection mixer to provide additional filtering. The received RF television signals are converted to a standard 45.75 MHz IF signal for processing on-chip by additional circuitry.

57 Claims, 4 Drawing Sheets

BROADBAND INTEGRATED TELEVISION TUNER

This application is related to co-pending application entitled DUAL MODE TUNER FOR CO-EXISTING DIGITAL AND ANALOG TELEVISION SIGNALS assigned Ser. No. 08/904,693, and co-pending application entitled BROADBAND FREQUENCY SYNTHESIZER assigned Ser. No. 08/904,907, both of which are filed concurrently herewith and assigned to a common assignee, which applications are hereby incorporated by reference herein. This application is also related to co-pending applications entitled HIGHLY INTEGRATED TELEVISION TUNER ON A SINGLE MICROCIRCUIT assigned Ser. No. 08/426,080 filed Apr. 21, 1995, now U.S. Pat. No. 5,737,035 issued Apr. 7, 1998, and co-pending application entitled INTERFERENCE-FREE BROADBAND TELEVISION TUNER assigned Ser. No. 08/904,906, co-filed, now U.S. Pat. No. 5,847,612 issued Dec. 8, 1998, both of which are assigned to a common assignee, which applications are hereby incorporated by reference herein.

TECHNICAL FIELD OF THE INVENTION

This invention relates to television tuner circuits and more particularly to a broadband analog television tuner fabricated in a microcircuit device.

BACKGROUND OF THE INVENTION

One of the most significant costs in television manufacturing is the cost of the tuner. The typical cost of a television (TV) tuner is in the neighborhood of $15.00, which, relative to the cost of the entire television set, is very substantial. Part of the solution to reducing tuner cost is to reduce the number of components in the tuner.

Traditionally, tuners have been comprised of two basic components. The first component performs high frequency to intermediate frequency (RF to IF) conversion. Subsequently, the second component performs IF to baseband conversion. The TV tuner was originally designed for broadcast television reception within a television set, which is essentially a stand-alone unit containing a cathode ray picture tube. So, TV tuners were originally integral parts embedded in a single-purpose device.

Presently, however, state-of-the-art consumer electronic devices use TV tuners that are not a built-in part of a television set. The tuner is a separate element that is connected to a cathode ray picture tube at some point, but the tuner is not an integral part of the monitor. For example, TV tuners may be fabricated on circuit boards and then installed in personal computer (PC) systems, thereby allowing the PC to function as a television set. These tuners convert a radio frequency television signal into a baseband (or low frequency) video signal which can then be passed on to other elements in the PC for video processing applications.

The circuit component that performs the RF-to-IF conversion typically comprises one or two integrated circuits and numerous discrete elements—inductors, capacitors and/or transistors. The IF-to-baseband conversion typically includes another integrated circuit, several filter elements, such as ceramic filters and SAW filters, a series of tuning and control elements, such as resistors and potentiometers, variable inductors and/or capacitors, and some other additional external components. Thus, the complexity of the tuner is fairly high and typically there may be between 100 and 200 elements on a circuit board. Furthermore, state-of-the-art TV tuners still require that each tuner be aligned by manual tuning before leaving the factory. This manual tuning is one of the most expensive costs associated with the manufacturing process and an important factor in the cost of tuners.

Broadcast television tuners of the past have gone through an evolution over a period of more than 60 years. The earliest tuners utilized vacuum tube technology and required that the minimum number of vacuum tubes possible be used due to their cost, power consumption and dimensions. Therefore, passive components, such as resistors, capacitors, inductors and transformers, were used as much as possible in most designs. This style of design continued until about 1960 when TV tuner components, particularly vacuum tubes, began to be replaced by bipolar and MOS transistors. However, the active device count still defined the cost and size limits of TV tuners and active device count minimization continued.

In the early 1970's the integrated circuit became viable as an element in the television tuner and the design techniques were dramatically changed. Many functions of the tuner utilizing only one tube or transistor were being replaced with 4 to 20 individual transistors which could perform the same function with better precision, less space, less power, less heat generation and lower cost. The introduction of the integrated circuit was gradual, first encompassing only low frequency elements and then eventually high frequency active elements. Nonetheless, many passive elements external to the integrated circuits remained in TV tuner designs.

One advance, the SAW (surface acoustic wave) filter, made a significant change in that several manually tuned inductors and capacitors could be removed from the tuners and receive-filtering performance could be improved within a much smaller space and at reduced cost. However, the SAW filter, which is fabricated on a ceramic substrate, cannot be integrated on a silicon wafer with the rest of the active circuitry and must therefore remain a discrete component in the final design. The trend of the 1980's was to miniaturize all of the passive components and simplify their associated manual tuning at the factory. In recent years, TV tuners have been reduced in size from requiring fairly large enclosures, about 2"×5"×1", to much smaller enclosures, about ½"×2"×⅜". There is a high premium placed on small size because TV tuners are being used in smaller and smaller computers, television sets and VCRs. As the equipment in which tuners are used becomes smaller, the size of the TV tuner must decrease also.

As the size of the tuner goes down, and as tuners are used in a wider variety of devices, cost becomes more critical and must be reduced as much as possible in order not to represent a large portion of the final product cost. When a tuner is used in a television set, the tuner size is less critical because the television set inherently has a large mass. But when a tuner is used in other electronic equipment, space becomes a premium and the footprint of the tuner becomes critical.

Accordingly, it is one object of the invention to provide a TV tuner which has a relatively low cost and a small footprint for use on a printed circuit board.

It is another object of the present invention to provide a TV tuner that meets or exceeds the performance of state-of-the-art TV tuners while at the same time reducing the number of external components needed, thereby decreasing the complexity of the printed circuit board and the amount of circuit board area needed by the TV tuner.

It is the further object of the present invention to allow for computer control of the TV tuner by a serial bus so that the TV tuner may be controlled by a microcontroller imbedded in the television set, personal computer, or other video device.

It is the further object of the present invention to provide a TV tuner with computer-controlled output impedance characteristics to accommodate different load specifications.

SUMMARY OF THE INVENTION

These and other problems have been solved by a television tuner that receives a broad band of RF signals and converts a desired RF television channel to an IF signal having a picture carrier at 45.75 MHz. To accomplish this, an architecture was chosen to perform an up-conversion of the RF input signal to a higher internal frequency, which allows the present invention to have minimal filtering on the input stages of the receiver. The present invention is therefore able to operate without variable-tuned input filtering. This eliminates the need for precisely controlled variable tuned filters which must be mechanically aligned during manufacture and are subject to variation in performance due to age, temperature, humidity, vibration and power supply performance. This was a critical drawback of previous tuners that had to be eliminated because it is a source of tremendous error and distortion, as well as complexity.

The present invention allows a wide band of frequencies to enter the front end of the tuner circuit without removing frequencies in an input band pass tracking filter. An input filter allows RF signals, typically in the range from 55–806 MHz, to enter the circuit while rejecting high frequency signals above the television band. The input signal then passes through a low noise amplifier that controls the input signal level. Following the input filter and amplifier, the RF signal is converted to an IF signal in a dual mixer conversion circuit. The conversion circuit generally up-converts the RF to a first IF signal and then down-converts the first IF signal to a second IF signal having a 45.75 MHz picture carrier.

It is advantageous to have the up-conversion performed on-chip to avoid drive capability problems associated with high frequency signals and noise coupling problems resulting from integrated circuit external interconnections. Following the up-conversion, a first IF band pass filter performs coarse channel selection. The present invention next performs a down-conversion on the output of the first IF filter. The down-conversion may be accomplished by an image rejection mixing scheme that provides for a higher level of image rejection than that provided solely by the first IF filter. The use of an image rejection mixer for down-converting the first IF signal is optional depending upon the characteristics of the first IF filter and its ability to reject unwanted signals.

The present invention advantageously utilizes much less board space than previous designs (on the order of 5% to 10% of the prior art designs) and has the potential to dissipate less power. The present invention also advantageously operates on a single voltage level, as opposed to two or three levels for previous designs.

A further technical advantage of the present invention is that the need for a metal enclosure is reduced. Integration, by itself, allows for sufficient shielding to meet interference standards. The monolithic television (MTV) tuner embodied in the present invention is intended to replace the TV tuner modules presently used in most broadcast television receiver devices. The level of integration of the present invention dramatically reduces the cost of the basic TV tuner and enhances its manufacturability and reliability. The TV tuner of the present invention is controlled externally by a computer or controller via a digital serial bus interface, such as the ($I^2C$) bus defined by Philips Electronics N. V. A preferred embodiment of the present invention provides an antenna input capable of being connected directly to a standard coaxial cable, thereby allowing both antenna and cable television applications.

A preferred embodiment of the present invention is designed to operate on frequencies used for both over-the-air broadcasts and cable television with National Television Standards Committee (NTSC) encoded video. Receiver sensitivity is set to be limited by the antenna noise temperature for VHF systems. The present invention also employs a wide-range automatic gain control (AGC).

For analog television signals, the baseband video output of the present invention is leveled, or has minimal variation in video amplitude with respect to antenna RF signal level. Audio output is broadband composite to allow connection to an external MTS decoder.

Control is accomplished via a digital service bus interface. The bias and control circuits in a preferred embodiment of the present invention contain internal registers which can be updated via the control bus in response to changes in operating frequency, transmission standards such as NTSC, PAL, SECAM and MTS, power, and test modes. Status of the bias and control circuits can be checked via a status register accessible through the $I^2C$ bus interface. Status data include AFC error, channel lock and received signal strength indicator.

The operating frequency of the present invention is referenced to an external crystal or reference frequency generator. A minimum of external components are used in one embodiment of the present invention to reduce the need for tuning of any components.

The present invention may be implemented in Bipolar, BiCMOS, or CMOS processes. However, a preferred embodiment of the present invention employs a BiCMOS process to reduce the difficulty in developing the design by allowing maximum flexibility.

In the preferred embodiment, the present invention would be constructed entirely on a single integrated substrate. However, design, manufacturing and cost considerations may require that certain elements be embodied as discrete off-chip devices.

The foregoing has outlined rather broadly the features and technical advantages of the present invention in order that the detailed description of the integrated television tuner that follows may be better understood. Additional features and advantages of the monolithic television tuner will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PRIOR ART

Before discussing the monolithic television tuner of the present invention, it will be useful to discuss a state-of-the-art television tuner found in the prior art.

While there have been theoretical proposals to integrate TV tuners in a single microcircuit, none are known to have been implemented. The next best definition of the known prior art, then, is a highly miniaturized, but not fully integrated, tuner as shown in FIG. 4.

Figure 4:
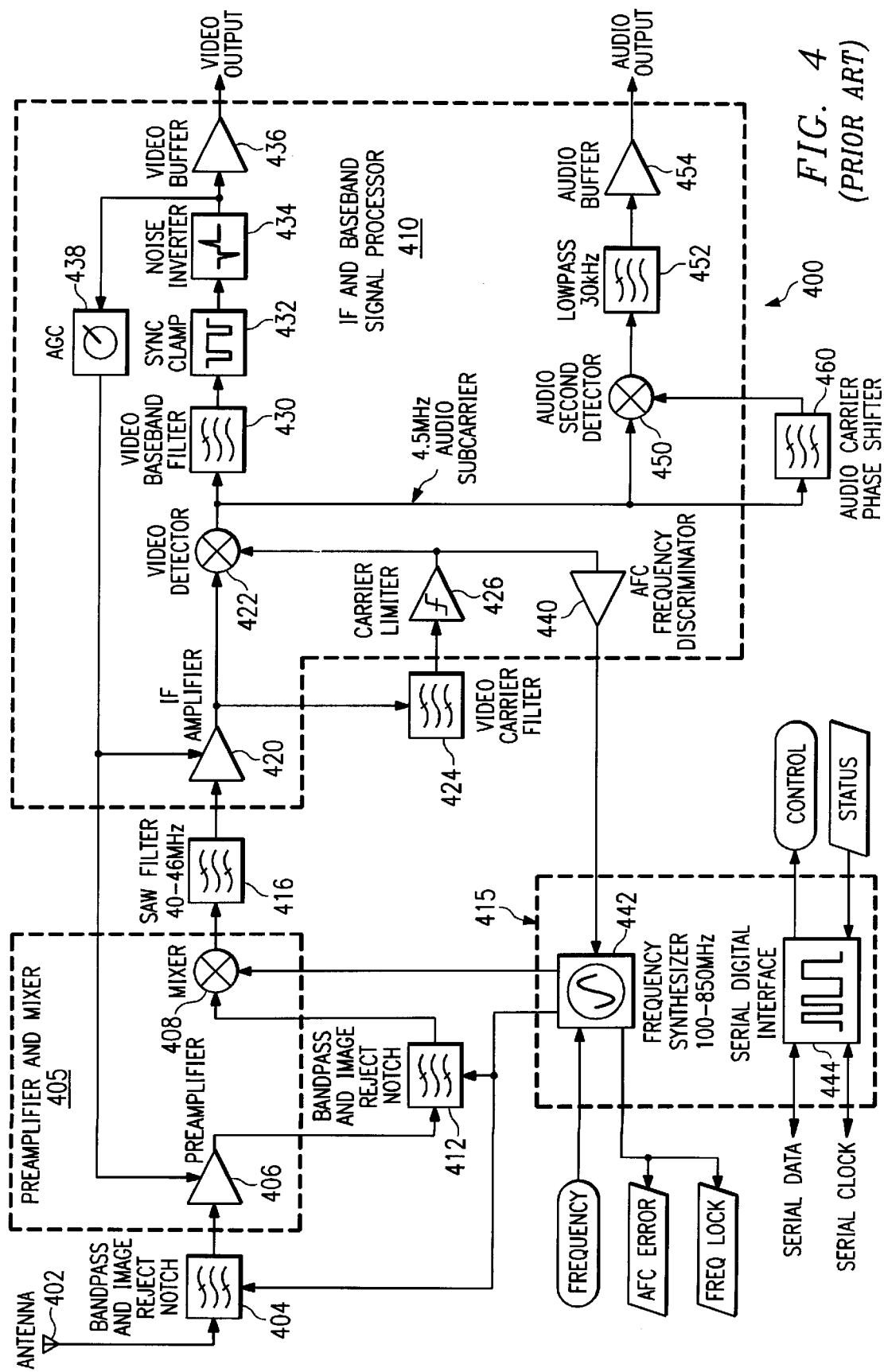
FIG. 4 is a detailed block diagram of a state-of-the-art television tuner found in the prior art.

FIG. 4 depicts a functional electrical block diagram of a present state-of-the-art TV tuner configuration. Television tuner 400 is constructed in a single metallically shielded assembly containing a printed circuit board on which all of the associated tuner components are mounted and electrically connected. TV tuner 400 is designed to be a module mounted on other printed circuit boards to allow for direct connection of the input and output signals to their appropriate terminations within the television receiving system. The metal shield is used to keep undesired external signals from interfering with the operation of the TV tuner 400 and to prevent TV tuner 400 from radiating signals that interfere with the operation of external devices.

Prior art television tuner 400 is comprised of three integrated circuits: preamplifier and mixer 405, IF and baseband signal processor 410 and frequency synthesizer and Inter Integrated Circuit (IIC or I$^2$C) bus interface 415. Television tuner 400 is also comprised of a plurality of discrete components, including bandpass and image reject notch filter 404, bandpass and image reject notch filter 412, surface acoustic wave (SAW) filter 416, video carrier filter 424, and audio carrier phase shifter 460.

Television tuner 400 receives a standard television RF signal from either antenna 402 or a cable system connection (not shown) through bandpass and image reject notch filter 404. Bandpass and image reject notch filter 404 limits the signals entering TV tuner 400 so that a minimum number of undesired signals exist in TV tuner 400. Filter 404 therefore limits the image response caused by the first mixer, described later. Filter 404 also attenuates signals not in a fairly narrow (100 MHz) range about the desired signal. Finally, known interference signals, such as FM broadcast, shortwave service signals, signals in the intermediate frequency band and Citizen Band radio signals, are specifically rejected by filter 404.

Preamplifier 406 of preamplifier and mixer 405 receives the output of bandpass and image reject notch filter 404 and raises the signal level (10 dB) with minimum increase in the noise level (typically 8–10 dB). The gain of preamplifier 406 is controlled by automatic gain control (AGC) 438, so that when a very strong signal enters TV tuner 400, overall gain is reduced, resulting in less distortion in the preamplifier than without the gain reduction.

The output of preamplifier 406 is sent to bandpass and image reject notch filter 412, with the same basic requirement of minimizing the passage of potential interference signals. Filter 412 is external to preamplifier and mixer 405 and is comprised of a plurality of discrete elements, including capacitors, inductors and varactor diodes.

The output of bandpass and image reject notch filter 412 is then sent back to mixer 408 in preamplifier and mixer 405. Mixer 408 mixes the output of filter 412 with the output of a local oscillator, frequency synthesizer 442, which has a frequency chosen to be higher than the desired receiver carrier by 45.75 MHz. Thus, the output of mixer 408 is 45.75 MHz. There also is an image signal due to mixer 408 at 91.5 MHz above the input frequency, which is removed by filter 404 and filter 412. Therefore, as the frequency of frequency synthesizer 442 is tuned to receive signals of different carrier frequencies, the bandpass and image reject filters 404 and 412 must also be tuned to properly pass only the desired signals and not the mixer images.

Frequency synthesizer 442 receives an input frequency reference signal (usually 16 bits) and outputs the status signals AUTOMATIC FREQUENCY CONTROL (AFC) ERROR and FREQUENCY (FREQ) LOCK. Additionally, a tuning signal which is used by the voltage controlled oscillator (VCO) in frequency synthesizer 442 is output from frequency synthesizer 442 to bandpass and image reject notch filters 404 and 412. A local oscillator signal is output from frequency synthesizer 442 to mixer 408.

The 45.75 MHz output signal of mixer 408 then passes through SAW (surface acoustic wave) filter 416, which limits the bandwidth of the signal to only one (1) channel (6 MHz for NTSC standard) and applies a linear attenuation in frequency known as the Nyquist slope around the visual carrier frequency. The linear attenuation by SAW filter 416 converts the signal from a vestigial sideband signal to one which is equivalent to a single sideband with a carrier, so that the frequency response of the signal after demodulation is flat over the video bandwidth. SAW filter 416 is very "lossy" (on the order of 25 dB), so the input to SAW filter 416 is amplified by a preamplifier (not shown) by a corresponding amount to minimize noise effects.

The output of SAW filter 416 is input to intermediate frequency (IF) amplifier 420 in IF and baseband signal processor 410. IF amplifier 420 provides most of the overall gain of TV tuner 400 and receives gain control from AGC 448.

The output of IF amplifier 420 is sent to video detector 422 and is also sent off-chip to external video carrier filter 424. This is the stage at which video demodulation is performed. Video detector 422 is essentially a mixer with the local oscillator input connected to the output of video carrier filter 424 through carrier amplitude limiter 426. The output of the carrier limiter 426 is an in-phase representation of the video carrier signal without any modulation applied to it. The output of carrier limiter 426 is received by video detector 422, which mixes the output of carrier limiter 426 with the output of IF amplifier 420.

AFC frequency discriminator 440 is used in the prior art device to detect the difference between the carrier frequency contained in the output of carrier limiter 426 and a known valid carrier frequency reference. The output signal on the output of AFC frequency discriminator 440 is an error signal which is used to drive frequency synthesizer 442 in a direction that will reduce the error between the output of carrier limiter 426 and the known valid carrier frequency reference. The output of the video detector 422 is a baseband video signal combined with several high frequency mixing artifacts. These artifacts are removed by a video baseband filter 430. The output of video baseband filter 430 is fed to synchronization pulse clamp (sync clamp) 432, which sets the level of the sync pulses to a standard level.

Next, the output of sync clamp 432 is sent to noise invertor 434, which removes large noise spikes from the signal. The output of noise invertor 434 is sent to video buffer 436, which is configured to drive fairly high circuit board impedances of approximately 1000 to 2000 ohms.

The output of noise invertor 434 is also sent to AGC (automatic gain control) 438, which compares the level of the synchronization pulses to the signal blanking level to measure the incoming signal strength and generates a gain control signal which is used by IF amplifier 420 and RF preamplifier 406 to dynamically adjust the gain of the TV tuner 400 for the correct level at the final output.

The audio signal is an FM signal which follows the same path as the video through video detector 422. At the output of video detector 422, the audio signal appears as a subcarrier at 4.5 MHz, due to the fact that the audio signal comes into prior art TV tuner 400 4.5 MHz higher in frequency than the desired video carrier. The audio subcarrier is passed on to an FM quadrature demodulator. The FM quadrature demodulator is comprised of a mixer, audio second detector 450, and a 90 degree (at 4.5 MHz) phase shifter, audio carrier phase shifter 460. The output of the audio second detector 450 is a baseband audio signal, which is filtered by lowpass (30 kHz) filter 452 to remove any undesired high frequency components. The output of lowpass filter 452 is finally passed on to audio buffer 454, which drives an audio amplifier that ultimately drives a speaker. Serial digital interface 444 receives SERIAL DATA and SERIAL CLOCK inputs to provide control and update status for the prior art television receiver.

Baseband and image reject notch filters 404 and 412 are typically comprised of a plurality of capacitors, inductors and varactor diodes. Video carrier filter 424 is usually comprised of three discrete elements: an inductor and two capacitors. Likewise, audio carrier phase shifter 460 is also comprised of an inductor and two capacitors. In addition to the circuit elements shown as discrete components outside of circuit elements 405, 410 and 415 in FIG. 4, other discrete components (not shown) are connected to IF and baseband signal processor 410 and frequency synthesizer 442 for tuning purposes. Frequency synthesizer 442 is typically tuned by several external capacitors, inductors and/or varactor diodes. Video buffer 436 and audio buffer 454 will also typically employ external discrete elements, such as resistors, capacitors and/or transistors. Video baseband filter 430 and low pass filter 452 may also employ external inductors and capacitors.

DETAILED DESCRIPTION OF THE INVENTION

Figure 1:
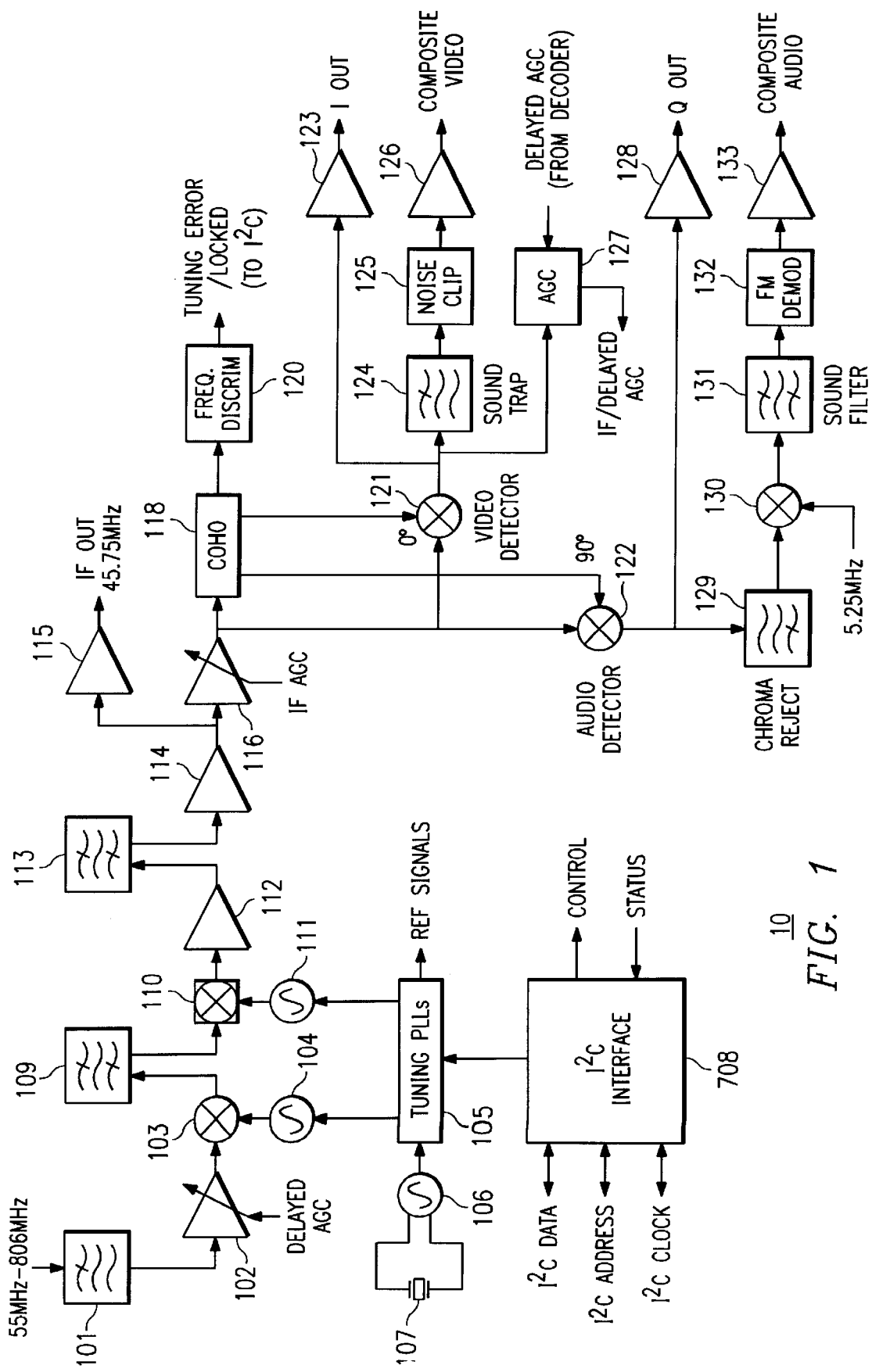
FIG. 1 is a detailed block diagram of the present invention.

Turning now to FIG. 1, the preferred embodiment of the present invention is shown as broadband television tuner 10. The operation of the IF signal processing components of tuner 10 is further disclosed in the above-referenced co-pending applications entitled DUAL MODE TUNER FOR CO-EXISTING DIGITAL AND ANALOG TELEVISION SIGNALS, and INTERFERENCE-FREE BROADBAND TELEVISION TUNER and BROADBAND FREQUENCY SYNTHESIZER. RF signals are received in tuner 10 through input filter 101 which has a high dynamic range and good linearity across the television frequency band. Filter 101 operates to attenuate signals above an input cutoff frequency corresponding to the highest frequency in the television band. As distinguished from the prior art, filter 10 is not a narrow band pass tracking filter which attenuates most television channels from the received signal. Instead, filter 101 passes all channels in the television band.

Following filter 101, the RF signal passes through delayed AGC amplifier 102 which operates in conjunction with IF AGC amplifier 116 to control the overall signal level in tuner 10. Amplifier 102 may be a variable gain amplifier or a variable gain attenuator in series with a fixed gain amplifier. The preferred embodiment of amplifier 102 comprises a low noise amplifier (LNA) with a high linearity that is sufficient to pass the entire television band. Amplifier 102 functions to control high input signal levels in the received RF signal. Tuner 10 is capable of receiving signals from a variety of sources, such as an antenna or a cable television line. The cable television signals may have a signal strength of +15 dBmV and may comprise 100 cable channels. Amplifier 102 regulates the varying signal levels in this broad band of received channels.

Mixer 103 receives inputs from amplifier 102 and local oscillator 104. A first IF signal is generated in mixer 103 and provided to first IF filter 109. Filter 109 is a band pass filter that provides coarse channel selection in tuner 10. As a matter of design choice, filter 109 may be constructed on the same integrated circuit substrate as mixers 103 and 110 or filter 109 may be a discrete off-chip device. Filter 109 selects a narrow band of channels or even a single channel from the television signals in the first IF signal.

Following IF filter 109, mixer 110 mixes the first IF signal with a second local oscillator signal from local oscillator 111 to generate a second IF signal. Mixer 110 may be an image rejection mixer, if necessary, to reject unwanted image signals. The characteristics of first IF filter 109 will determine whether mixer 110 must provide image rejection. If the image frequencies of the desired channel are adequately attenuated by first IF filter 109, then mixer 110 may be a standard mixer.

Local oscillators 104 and 111 are controlled by tuning phase locked loop circuit 105. In the preferred embodiment, the local oscillator frequencies are selected so that the picture carrier of a particular channel in the RF signal will appear at 45.75 MHz in the second IF signal. However, it will be understood that the present invention is not limited to specific IF or LO frequencies. Tuning PLL circuit 105 receives reference signals from reference oscillator 106 which is driven by 5.25 MHz crystal 107. $I^2C$ 108 provides control inputs and monitors the status of tuner 10 and tuning PLL circuit 105.

In operation, the front end of tuner 10 receives the entire television band through filter 101 and amplifier 102. Following mixer 103, the RF input is converted so that a selected channel in the RF signal appears at a first IF frequency that is selected to pass through filter 109. The first IF frequency is then converted to a second IF frequency of 45.75 MHz at the output of mixer 110. The frequencies of the first and second local oscillator signals will vary depending upon the specific channel in the RF signal that is desired. In the preferred embodiment, the first local oscillator frequency is selected so that mixer 103 performs an up-conversion of the RF signal. Following filter 109, the first IF signal is then down-converted to 45.75 MHz in mixer 110.

Following mixer 110, the second IF signal is further processed by either digital or analog circuits. Second IF filter 113 may be constructed on the same integrated circuit substrate as the other elements of tuner circuit 10 or it may be a discrete off-chip device. When second IF filter 113 is a discrete off-chip element, then amplifiers 112 and 114 are used to provide proper impedances for filter 113 as well as to provide gain to maintain system noise performance. After amplifier 114, the signal either remains on-chip for further processing or it can be provided to an off-chip device, such as a decoder (not shown), through buffer 115.

If the signal is processed on-chip, then the second IF signal passes through IF AGC amplifier 116 which operates in conjunction with delayed AGC amplifier 102 to control the overall tuner gain. One output of amplifier 116 is provided to coherent oscillator (COHO) circuit 118. COHO 118 generates two reference signals, one that is in-phase with the 45.75 MHz second IF signal and another that is 90° out-of-phase with the second IF signal. A third output from COHO 118 is provided to frequency discriminator 120 which monitors the frequency of the signal that is processed in COHO 118 and generates a tuning error signal for I2C control 108.

AGC amplifier 116 also drives video detector 121 and audio detector 122. Video detector 121 mixes the second IF signal with the in-phase reference signal from COHO 118. AGC circuit 127 monitors the output of video detector 121 and adjusts the gain of amplifiers 102 and 116 in order to control the overall tuner gain. If an off-chip decoder is connected to tuner 10 through buffer 115, then the decoder can control the signal gain by providing an input directly to AGC 127.

The signal from video detector 121 passes through sound trap 124 which removes the audio carrier from the signal. The output of sound trap 124 drives noise clipping circuit 125 which removes large noise spikes which may be present in the video signal. Finally, a composite video signal is provided through buffer 126.

Audio detector 122 mixes the second IF signal with the 90° out-of-phase or quadrature signal from COHO 118. The output signal from audio detector 122 will contain an audio carrier at 4.5 MHz and a chroma carrier at approximately 3.6 MHz. Chroma reject filter 129 is a high pass filter that removes the picture and chroma carriers from the output of audio detector 122. The remaining audio signal is then mixed with a 5.25 MHz reference signal in mixer 130 to create a 750 KHz output. Sound filter 131 is a band pass filter that further filters the 750 KHz audio signal. FM demodulator 132 is a delay line type of demodulator which creates a standard composite audio signal from the 750 KHz FM audio signal. This audio signal is then provided as the composite audio signal through buffer 133.

In an alternative embodiment of the present invention, a plurality of tuners 10 are placed on a single integrated substrate and a single RF input drives the plurality of tuners 10. This allows a single integrated device to concurrently provide different television channels through the output of each tuner. This embodiment could be used to drive a "picture-in-a-picture" display or any other display format that requires multiple tuners. In another alternative embodiment, the plurality of tuners on a single substrate are coupled to independent RF signal sources and provide independent television signals.

The present invention can be used in applications other than a conventional television receiver. Tuner 10 can be embodied as part of an "add-in" board or a component of a personal computer. This allows a user to receive and view television signals on the computer's display. The user could also record or capture television programs directly to the computer's memory. The computer could then be used to replay recorded programs or to manipulate or alter selected frames or segments of the captured video and audio signal, or the computer may capture data which may have been imbedded in the video signal.

Furthermore, the present invention will be understood to not be limited to an integrated substrate. Prior art tuners require the use of a narrow-band, tunable filter to eliminate undesired channels from the receiver. The present invention is distinguished over the prior art by allowing all frequencies in a desired band to enter the front-end of tuner 10 and by removing undesired channels through filtering of the IF signal.

Figure 2:
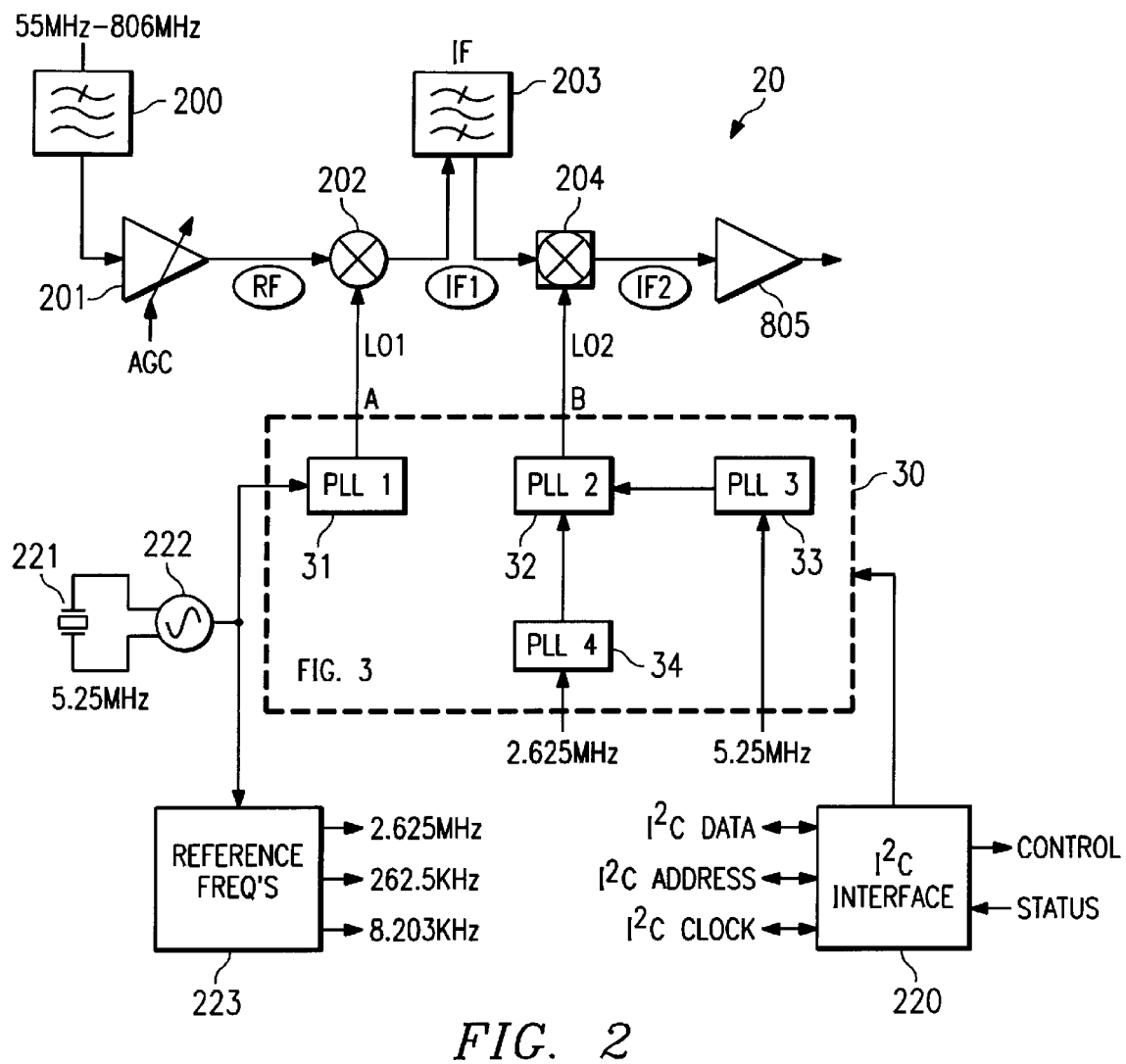
FIG. 2 shows the multiple phase lock loop circuit for creating the LO reference signals.

FIG. 2 shows multiple phase locked loop (PLL) circuits which are used to drive voltage controlled oscillators (VCOs) in order to generate the LO signals for a dual mixer conversion circuit.

Conversion circuit 20 has dual mixers 202 and 204 which receive LO signals LO1 and LO2 on lines A and B from local oscillator circuit 20.

In a television system, signals representing individual channels are assigned to specific frequencies in a defined frequency band. For example, in the United States, television signals are generally transmitted in a band from 55 MHz to 806 MHz. The received RF signals pass through a front-end filter 200. In the prior art, filter 200 usually was a bandpass tracking filter that allowed only a narrow range of frequencies to pass. In the preferred embodiment, filter 200 is a low pass filter that is designed to remove all frequencies above an input cutoff frequency. The input cutoff frequency is chosen to be higher than the frequencies of the channels in the television band. The output of filter 200 then passes through amplifier 201 to adjust the signal level that is provided to mixer 202. When conversion circuit 20 is used in a receiver circuit, amplifier 201 may be an automatic gain control (AGC) amplifier that is adjusted to maintain an overall receiver gain. Following amplifier 201, the RF signal is provided to mixer 202 where it is mixed with a local oscillator signal LO1 from local oscillator circuit 30. The output of mixer 202 is first intermediate frequency signal IF1. Typically, the frequency of LO1 is variable and will be selected based upon the channel in the RF signal that is being tuned. LO1 is selected so that mixing of LOI and RF in mixer 202 generates an IF1 signal either at a specified frequency or within a narrow range of frequencies.

Following mixer 202, IF filter 203 is a band pass filter that is used to remove unwanted frequencies and spurious signals from the IF1 signal. The band of frequencies that are passed by filter 203 is a matter of design choice depending upon the IF1 frequency selected in each particular conversion circuit. In the preferred embodiment, IF filter 203 is centered at 1090 MHz and has a 14 MHz pass band. This allows the selected IF1 frequency to vary within 1083–1097 MHz. Mixer 204 receives both the filtered IF1 signal from filter 203 and a second local oscillator signal (LO2) from oscillator circuit 20. These signals are mixed to generate a second intermediate frequency (IF2) at the output of mixer 204. In the preferred embodiment, mixer 204 is an image rejection mixer that rejects image frequencies from the IF2 signal. LO2 may be a variable or fixed frequency depending upon whether IF1 is at a fixed frequency or if it varies over a range of frequencies. In either case, the frequency of LO2 is selected to generate a fixed frequency IF2 signal. The IF2 signal is provided through amplifier/buffer 205 to additional processing circuitry (not shown) to generate either digital or analog television signals. In the preferred embodiment, the frequency of IF2 is selected to be 45.75 MHz.

An additional consideration when using a dual mixer conversion circuit in a television receiver is the relationship of the picture, chroma and audio carriers in an analog television signal. This is discussed in the above-referenced applications.

For analog television signals, it is desirable to choose a combination of LO1 and LO2 so that the relationship between the picture, chroma and audio carriers is always the same in the IF2 signal. When the IF2 signal is further processed after amplifier 205, it may be a consideration that the analog processing circuits are able to find the chroma and audio carriers in the same place, either above or below the picture carrier, for every channel. In the preferred embodiment, LO1 and LO2 are selected so that the IF2 spectral relationship is the inverse of the RF spectral relationship. That is, the picture carrier is converted from an RF signal of 55–806 MHz to an IF2 signal at 45.75 MHz with the audio carrier 4.5 MHz below the picture carrier and the chroma carrier 3.6 MHz below the picture carrier.

The audio and chroma carriers are below the picture carrier frequency. This is accomplished by using the lower LO2 frequency (1041 MHz) with the higher LO1 frequency (1160.25 MHz) or using the higher LO2 frequency (1137.5 MHz) with the lower LOI frequency (1018.5 MHz).

LO1 is generated in local oscillator circuit 30 (FIG. 3) by PLL1 31 and L02 is generated by PLL2 32. PLL3 33 and PLL4 34 provide reference inputs to PLL2 32. I2C 320 controls local oscillator circuit 30 and causes PLL1-4 31–34 to select the correct LO0 and L02 frequencies. Local oscillator circuit 30 receives reference signals from oscillator 222 and reference frequency generator 223. Oscillator 222 provides a 5.25 MHz output based on crystal 221. Frequency generator 223 divides the 5.25 MHz signal from oscillator 222 to generate additional reference signals at other frequencies.

Figure 3:
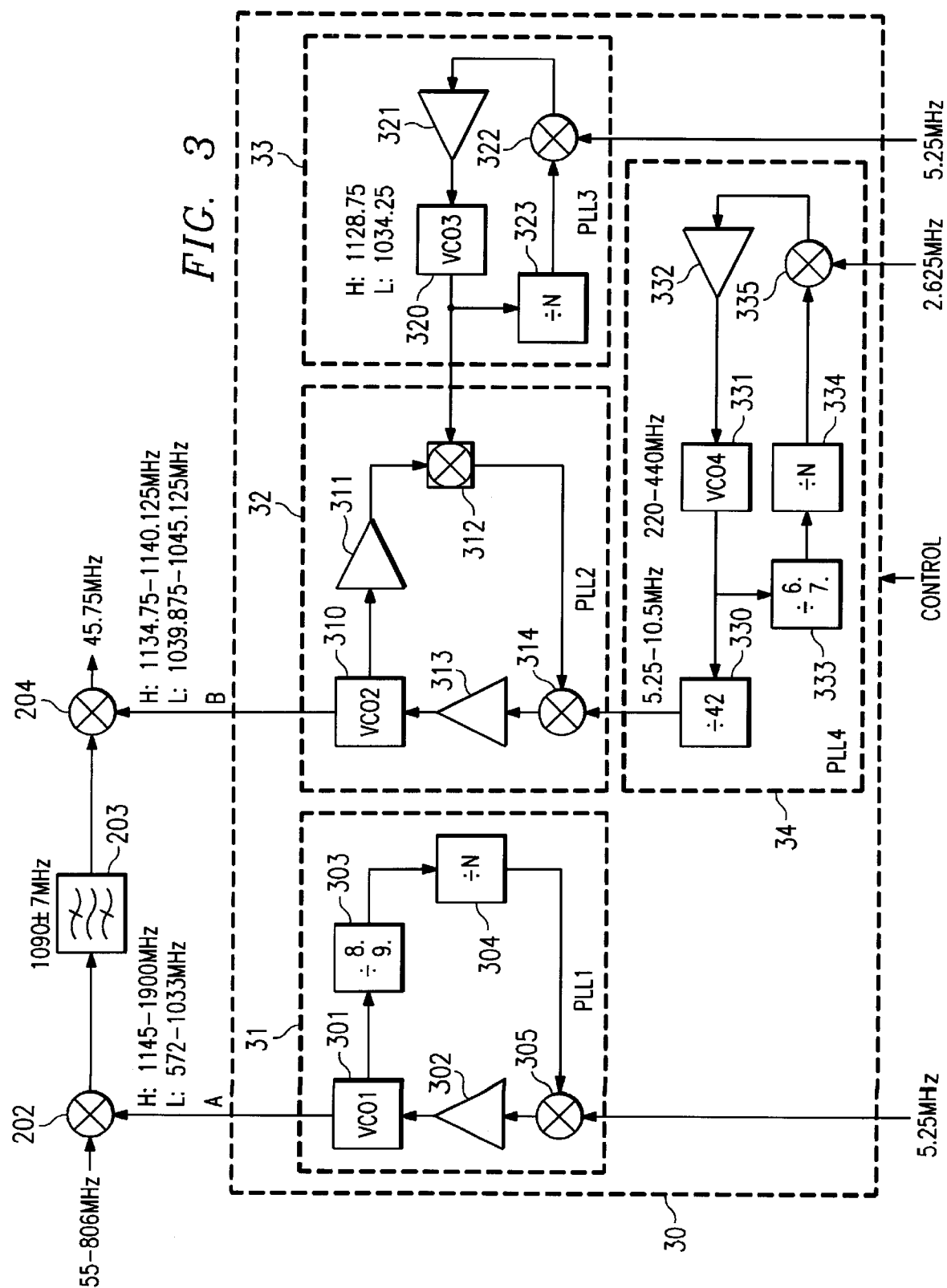
FIG. 3 is a detailed diagram of the phase lock loop circuit.

Local oscillator circuit 30 and PLL1-4 31–34 are shown in greater detail in FIG. 3. PLL1 31 provides the first local oscillator signal (LO1) to mixer 302. PLL2 32, PLL3 33 and PLL4 34 cooperate to provide the second local oscillator signal (LO2) to mixer 204. PLL1 31 receives a 5.25 MHz reference signal at phase comparator 305. The output of phase comparator 905 feeds loop amplifier 302 which, in turn, provides the input for VCO1 901. There are two outputs from VCO1 301. One output provides the LO1 signal to mixer 202 over line A. The other output goes into a divider network comprised of ÷8/÷9 circuit 303 and ÷N circuit 304. Divider circuits 303 and 304 divide the output of VCO1 301 down to a signal having a frequency of 5.25 MHz. This divided-down signal is compared with the 5.25 MHz reference signal in phase comparator 305 to complete the phase locked loop.

The output of VCO1 31 is variable between 1145–1900 MHz on the high side and 572–1033 MHz on the low side. Frequencies below 572 MHz are not used in LO1 to minimize the introduction of interference frequencies into the conversion circuit. LO1 is chosen from within these ranges so that IF1 signal is within the 1090 MHz ±7 MHz pass band of filter 303. The 5.25 MHz reference signal creates an output stepsize of 5.25 MHz in LO1 which is utilized for coarse tuning in conversion circuit 10. In the preferred embodiment, PLL1 31 has a bandwidth on the order of 500 KHz. A wide bandwidth is preferable to get good close-in phase noise characteristics.

Fine tuning (for example to the exact desired channel) is accomplished by LO2 which is produced by the operation of 3 phase lock loops PLL2 32, PLL3 33 and PLL4 34. PLL4 34 has the same basic configuration as PLL1 31. It has reference signal of 2.625 MHz which is input to phase comparator 335. The output of phase comparator 335 drives loop amplifier 332 which in turn drives VCO4 331. The output of VCO4 331 has frequency range of 220–440 MHz with a 2.625 MHz stepsize and is provided to two divider circuits. One output of VCO4 331 goes to a divider network comprised of ÷6/÷7 circuit 933 and ÷N circuit 334. The effect of divider network 333 and 334 is to divide the output signal of VCO4 330 back down to 2.625 MHz. This signal is then compared with the 2.625 MHz reference signal in phase comparator 335 to complete the phase locked loop.

The other output of VCO4 331 is provided to ÷42 circuit 330. The output of divider 330 is a signal with a frequency range of 5.25–10.5 MHz and having a 62.5 KHz stepsize. The output of divider 330 serves as a reference signal for PLL2 32.

In PLL3 33, a 5.25 MHz reference signal is input to phase detector 322. Phase detector 322 drives loop amplifier 321 which in turn drives VCO3 320. The output of VCO3 33 is divided back down to 5.25 MHz by ÷N circuit 323 and then fed back into phase detector 322 to complete the loop. The output of VCO3 33 is selectable between 1128.75 MHz and 1034.25 MHz. The selection between these two frequencies determines whether LO2 is on the high side or the low side.

In PLL2 32, the signal from PLL4 34 is received by phase comparator 314 which in turn drives loop amplifier 313. The output of loop amplifier 313 controls VCO2 310. VCO2 310 provides the L02 signal for mixer 204 over line B. The LO2 signal varies between 1134.75–1140.125 MHz on the high side and 1039.875–1045.125 MHz on the low side. Another output from VCO2 310 passes through buffer amplifier 311 and then drives image reject mixer 312. Mixer 312 receives its other input from PLL3 33. Since the signal from PPL3 33 is near the frequency of the LO2 signal in VCO2 310, it is important that the reverse isolation between mixer 312 and VCO2 310 is good to prevent the PLL3 33 signal from passing into the LO2 output of VCO2 310. The output of mixer 312 is provided to phase comparator 314 to complete the loop in PLL2 32.

In the preferred embodiment, the loop bandwidths of PLL2 32, PLL3 33 and PLL4 34 are all wide to provide good overall close-in phase noise. PLL2 32 and PLL3 33 have bandwidths of approximately 300–500 KHz. The bandwidth of PLL4 34 is approximately 200–300 KHz. These bandwidths give phase noise at 100 KHz that is satisfactory for most applications.

The architecture of the frequency synthesis system provides for several benefits with respect to the overall operation of the tuner system. These benefits are in providing a lower distortion detection means, immunity to injection locking, a frequency synthesis system that allows for wide bandwidth PLLs while preserving a small step size, and providing for a choice of reference frequency that is out-of-band and that can be directly used to down-convert the audio portion of the desired channel.

A wide loop bandwidth for LO0 and LO2 is preferred because this yields good close-in phase noise characteristics for these two signals. This is important because it allows the COHO to have a narrow loop bandwidth, which yields a lower distortion video detector. For example, certain content within the video signal, such as the horizontal sync signal at approximately 15 KHz, would be partially tracked by a wide band COHO leading to distortion in the detection process. If the bandwidth of the COHO is less than 15 KHz, then the COHO would not partially track the horizontal sync signal leading to a near distortion free detection process. In the prior art, the oscillators used for conversion to IF typically do not have good close-in phase noise characteristics, requiring a COHO with wide loop bandwidth to track out this noise. It is thus typical in the prior art to employ wider bandwidth COHO's, which have the undesirable trait of partially tracking strong signals in the video signal, such as horizontal sync, leading to distortion in the detection process.

It is generally known that the immunity of a phase locked loop to injection locking is determined by the product of the quality factor, Q, of the VCO and the loop bandwidth. For the case of a VCO implemented on a single chip, it is typically difficult to realize high Qs. This conflicts with the integrated circuit implementation of a RF system with PLLs in that the other circuitry sharing the common substrate is a source of spurs that then may be passed on to the PLLs output or lead to injection locking by the PLL. Since a high Q VCO is not feasible without external components, the benefit of a wide loop bandwidth of the PLL is more pronounced.

It is typical in the prior art to make the PLL reference frequency equal to the step size of the frequency synthesizer system. It is further typical of the prior art to employ a single loop frequency synthesizer to create the first LO in tuners. For example, if the step size of the system was 62.5 KHz, then the reference frequency to the single loop PLL would also be 62.5 KHz. It is highly desirable to suppress harmonics and spurs of the reference that are in band to a level below the noise floor of the VCO, requiring the loop bandwidth of the PLL to be less than the reference frequency. In the case where the reference is the step size, the loop bandwidth is rather narrow. Consequently, is a clear advantage of the frequency synthesizer described herein to provide both a small step size as well as a wide bandwidth for LO1 and LO2 providing for enhanced immunity to spurs as well as providing for a narrow bandwidth COHO.

A further advantage of the frequency synthesis system is that it can use a reference that is above the baseband frequencies. An example of such a frequency is 5.25 MHz. It should be noted that this 5.25 MHz reference is above the baseband signal of the system, thus avoiding in-band noise produced by the reference and its harmonics. A further advantage of this choice of reference is that it can be used directly by the audio subsystem to down convert the frequency modulated audio signal to a lower frequency usable by the sound filter and FM demodulator in the audio subsystem. This eliminates the need for a PLL to create this frequency.

Although the present invention and its advantages have been described in detail, it should be understood that various changes, substitutions and alterations can be made herein without departing from the spirit and scope of the invention as defined by the appended claims.

What is claimed is:

1. A dual conversion IF tuner serving as the front end of a television receiver comprising:
 a low noise amplifier passing all channels in a received television band;
 a first mixer having a first input coupled to said low noise amplifier and a second input coupled to a first local oscillator signal, wherein said first mixer output a first IF signal;
 a first IF filter coupled to said first mixer and providing coarse channel selection, wherein said first IF filter removes all channels outside a selected frequency band from said first IF signal;
 a second mixer having a first input coupled to said first IF filter and a second input coupled to a second local oscillator signal;
 a second IF filter coupled to said second mixer and providing tine channel selection:
 an input filter coupled between a receiver input and said low noise amplifier, wherein said input filter removes all signals above an input cutoff frequency from received RF signals;
 a coherent oscillator circuit coupled to said second IF filter, wherein said coherent oscillator circuit generates an in-phase reference signal and a quadrature reference signal; and
 a video detector having a first input coupled to said second IF filter and a second input coupled to said in-phase reference signal from said coherent oscillator.

2. The RF tuner of claim 1 further comprising:
 a sound trap coupled to said video detector;
 a noise clipping circuit coupled to said sound trap; and
 an analog output buffer coupled to said noise clipping circuit;
 wherein said analog output buffer provides an away composite video signal.

3. A dual conversion RF tuner serving as the front end of a television receiver comprising:
 a low noise amplifier passing all channels in a received television band;
 a first mixer having a first input coupled to said low noise amplifier and a second input coupled to first local oscillator signal, wherein said first mixer outputs a first IF signal;
 a first IF filter coupled to said first mixer and providing coarse channel selection, wherein said first IF filter removes all channels outside a selected frequency bond from said first IF signal;
 a second mixer having a first input coupled to said first IF filter and a second input coupled to a second local oscillator signal, wherein said second mixer outputs a second IF signal;
 a second IF filter coupled to said second mixer and providing fine channel selection;
 a coherent reference phase lock loop fed by said second IF signal for generating a reference signal; and
 a frequency synthesizer for generating said first and second local oscillator signals, said frequency synthesizer having a phase noise characteristic that allows said coherent reference phase lock loop to have a narrow loop bandwidth.

4. A dual conversion RF tuner serving as the front end of a television receiver comprising:
 a low noise amplifier passing all channels in a received television band;
 a first mixer having a first input coupled to said low noise amplifier and a second input coupled to a first local oscillator signal, wherein said first mixer outputs a first IF signal;
 a first IF filter coupled to said first mixer and providing coarse channel selection, wherein said first IF filter removes all channels outside a selected frequency baud from said first IF signal;
 a second mixer having a first input coupled to said first IF filter and a second input coupled to a second local oscillator signal; and
 a second IF filter coupled to said second mixer and providing fine channel selection, wherein said first local oscillator signal provides coarse tuning with step size of greater than 4.5 MHZ, and wherein said coarse tuning is provided by a single voltage controlled oscillator and a wideband phase lock loop providing a highly coherent reference signal suitable for up-converting.

5. The tuner of claim 4 wherein the phase lock loop reference signal is greater than 4.5 MHZ.

6. A dual conversion RF tuner serving as the front end of a television receiver comprising:
 a low noise amplifier passing all channels in a received television band;

a first mixer having a first input coupled to said low noise amplifier and a second input coupled to a first local oscillator signal, wherein said first mixer outputs a first IF signal;

a first IF filter coupled to said first mixer and providing coarse channel selection, wherein said first IF filter removes all channels outside a selected frequency band from said first IF signal;

a second mixer having a first input coupled to said first IF filter and a second input coupled to a second local oscillator signal; and a second IF filter coupled to said second mixer and providing fine channel selection, wherein said second local oscillator signal provides fine tuning with step size less than or equal to 100 KHz, and wherein said fine tuning is provided by 3 voltage controlled oscillators and wideband phase lock loops providing a highly coherent reference signal suitable for down-converting.

7. The tuner of claim 6 wherein said phase lock loops utilize two reference signals, one greater than 2.25 MHZ and the other greater than 4.5 MHZ.

8. A dual conversion RF tuner serving as the front end of a television receiver comprising:

a low noise amplifier passing all channels in a received televisional band;

a first mixer having a first input coupled to said low noise amplifier and a second input coupled to a first local oscillator signal, wherein said first mixer outputs a first IF signal;

a first IF filter coupled to said first mixer and providing coarse channel selection, wherein said first IF filter removes all channels outside a selected frequency band from said first IF signal;

a second mixer having a first input coupled to said first IF filter and a second input coupled to a second local oscillator signal;

a second IF filter coupled to said second mixer and providing fine channel selection;

an input filter coupled between a receiver input and said low noise amplifier, wherein said input filter removes all signals above all input cutoff frequency from received RF signals;

a coherent oscillator circuit coupled to said second IF filter, wherein said coherent oscillator circuit generates an in-phase reference signal and a quadrature reference signal; and are audio detector having a first input coupled to said second IF filter and a second input coupled to said quadrature reference signal from said coherent oscillator.

9. The RF tuner of claim 8 further comprising:

a chroma reject filter coupled to said audio detector;

an audio down-converting mixer coupled to said chroma reject mixer;

a sound filter coupled to said audio mixer;

an FM demodulator coupled to said sound filter; and an analog output buffer coupled to said FM demodulator;

wherein said analog output buffer provides an analog composite audio signal.

10. The RF tuner of claim 9, wherein said low noise amplifier, said first mixer and said second mixer are physically located on the same integrated circuit substrate, and wherein said sound filter is not physically located on said integrated circuit substrate.

11. The RF tuner of claim 9, wherein said low noise amplifier, said first mixer, said second mixer and said sound filter are physically located on the same integrated circuit substrate.

12. A method of receiving RF signals comprising the steps of:

receiving RF signals comprising a plurality of channels;

filtering said received RF signals, thereby removing all signals above an input cutoff frequency from said RF signals;

amplifying said received RF signals in a low noise amplifier;

converting said RF signals to first IF signals comprising substantially all of said plurality of channels;

filtering said first IF signals to remove channels having frequencies outside of a selected hand;

converting the filtered first IF signals to second IF signals, wherein said converting said filtered first IF signals to second IF signals further comprises rejecting image signals turn said second IF signals; and filtering said second IF signals so that only one channel remains in said second IF signals, wherein said converting steps and said amplifying steps are performed on a single integrate circuit substrate, and wherein said filtering said received RF signals step is not performed on said single integrated circuit substrate.

13. The method of claim 12 wherein said second IF signal have a picture carrier at 45.75 MHZ.

14. The method of claim 12 further including the steps of:

duplicating said receiving, RF converting, first IF filtering, IF converting, and second IF filtering steps for a plurality of different selected ones of said channels.

15. The method of claim 14 wherein said duplicated converting steps arc performed on a single integrate circuit substrate.

16. The method of receiving RF signals of claim 15 filter comprising:

generating a first local oscillator signal for use in said converting said RF signals to first IF signals; and generating a second local oscillator signal for use in said converting said first IF signals to second IF signals, wherein said generating steps arc duplicated for said plurality of different selected ones of said channels, and wherein said generating steps are performed on said single integrated circuit substrate.

17. The method of receiving RF signals of claim 16 further comprising receiving digital serial bus control signals for use in controlling said generating steps, wherein said receiving digital serial bus control signals step is performed on said single integrated circuit substrate.

18. The method of receiving RF signals of claim 15 wherein said duplicated filtering steps are not performed on sad single integrated circuit substrate.

19. The method of receiving RF signals of claim 18 further comprising:

generating a first local oscillator signal for use in said convert said RF signals to first IF signals; and generating a second local oscillator of signal for use in said converting said first IF signals to second IF signals, wherein said generating steps are duplicated for said plurality of different selected once of said channels, and wherein said generate steps are performed on said single integrated circuit substrate.

20. The method of receiving RF signals of claim 9 further comprising receiving digital serial bus control signal for use in controlling said generating steps, wherein said receiving digital serial bus control signals step is performed on said single integrated circuit substrate.

21. The method of receiving RF signals of claim 12, wherein said selected band includes all of the channels available to said television receiver.

22. The method of receiving RF signals of claim 12 wherein said selected band is at least 55 MHZ to 806 MHZ.

23. The method of receiving RF signals of claim 12 further comprising:
generating a first local oscillator signal for use in said converting said RF signals to first IF signals; and
generating a second local oscillator signal for use in said converting said first IF signals to second IF signals, wherein said generating steps are performed on said single integrated circuit substrate.

24. The method of receiving RF signals of claim 23 further comprising receiving digital serial bus control signals for use in controlling said generating steps, wherein said receiving digital serial bus control signals step is performed on said single integrated circuit substrate.

25. The method of receiving RF signals of claim 12 wherein said filtering said IF signals steps are not performed on said single integrated circuit substrate.

26. The method of receiving RF signals of claim 25 further comprising:
generating a first local oscillator signal for use in said converting said RF signals to first IF signals; and
generating a second local oscillator signal for use in said converting said first IF signals to second IF signals, wherein said generating step, are performed on said single integrated circuit substrate.

27. The method of receiving RF signals of claim 26 further comprising receiving digital serial bus control signals for use in controlling said generating steps, wherein said receiving digital serial bus control signals step is performed on said single integrated circuit substrate.

28. The method of receiving RF signals of claim 12 wherein only one of said filtering said IF signals steps is not performed on said single integrated circuit substrate.

29. A method of receiving RF signals comprising the steps of:
receiving RF signals comprising a plurality of channels;
filtering said received REF signals, thereby removing all signals above an input cutoff frequency from said RF signals;
amplifying said received RF signals in a low noise amplifier;
converting said amplified RF signals to first IF signals comprising substantially all of said plurality of channels;
filtering said first IF signals to remove channels having frequencies outside of a selected band;
converting the filtered first IF signals to second IF signals, wherein said converting said filtered first IF signals to second IF signals further comprises rejecting image signals from said second IF signal;
filtering said second IF signals so that only one channel remains in said second IF
generating a first reference signal from said second IF signal, wherein said first reference signal is in-phase with said second IF signals; and
generating a second reference signal from said second IF signals, wherein said second reference signal is 90° out-of-phase with said second IF signals.

30. The method of claim 29 further comprising the steps of:
generating an analog composite video signal from said first reference signal and said second IF signals; and
generating an analog composite audio signal from said second reference signal and said second IF signals.

31. A receiver comprising one or more of dual conversion RF tuners, wherein each of said RF tuners comprises:
a low noise amplifier receiving RF signals and passing all channels in said received RF signals;
a first mixer having a first input coupled to said low noise amplifier and a second input coupled to a first local oscillator signal;
a first IF filter coupled to said first mixer and providing coarse channel selection:
a second mixer having a first input coupled to said first IF filter and a second input coupled to a second local oscillator signal; and
a second IF filter coupled to said second mixer and providing fine channel selected, wherein said first and second local oscillator signals are provided by a plurality of phase lock loops, wherein a first phase lock loop accepts a reference signal which is out of the bandwidth of a selected channel, said phase lock loops having low phase noise and a step size resolution smaller than the loop bandwidth of the individual phase lock loops, wherein said phase lock loops operate from input reference signals, some of which are outside or said bandwidth, and at least one of which is within said bandwidth, and wherein said one within said bandwidth is isolated from said output reference signal.

32. The receiver of claim 31 wherein each of said tuners are coupled to a single RF signal source.

33. The receiver of claim 32 wherein each of said tuners generates an IF signal, and wherein each said IF signal generated by said each of said tuners comprises a different channel in said RF signals.

34. The receiver of claim 31 wherein a first one of said phase lock loops provides coarse frequency resolution under control of said out of band input reference signal and wherein the step size of said coarse resolution is equal to said out of band input reference signal.

35. The receiver of claim 34 wherein a second set of phase lock loops provides fine frequency resolution under control of a combination of said out of band input reference signals and said isolated in band input reference signals.

36. The receiver of claim 31 constructed as a monolithic circuit.

37. The receiver of claim 36 wherein said coarse tuning is provided by a single VCO and wide baud PLL providing a highly coherent reference signal suitable for up-converting said signal of said first format and for said signal of said second format.

38. The receiver of claim 4 wherein the PLL reference signal is greater than 4.5 MHz.

39. The receiver of claim 36 wherein sad second local oscillator signal provides fine tuning with step size less than or equal to 100 KHz.

40. The receiver of claim 39 wherein said fine tuning is provided by three VCOs and wideband PLLs providing a highly coherent reference signal suitable for down-converting said signal.

41. The receiver of claim 40 wherein said PLLs utilize two reference signals, one greater than 2.25 MHZ and the other greater than 4.6 MHZ.

42. The receiver of claim 36 wherein said second local oscillator signals provides fine tuning with step size less than or equal to 200 KHz.

43. The receiver of claim 31 further including:
a plurality of other identical receivers all constructed on a single substrate.

44. The receiver of claim 31 wherein said receiver comprises a plurality of said RF tuners substantially on a single substrate.

45. The receiver of claim 44 wherein said amplifier and said first and second mixers of said plurality of RF tuners are physically located on the same integrated circuit substrate.

46. The receiver of claim 45 wherein said first and second IF filters of said plurality of RF tuners are physically locate on said integrated circuit substrate.

47. The receiver of claim 45 wherein said first and second IF filters of said plurality of RF tuners are not physically located on said integrated circuit substrate.

48. The receiver of claim 47 further comprising a frequency synthesizers for generating said first and second local oscillator signals for each of said plurality of RF tuners, wherein said frequency synthesizers are physically located on said integrated circuit substrate.

49. The receiver of claim 48 further comprising a digital serial bus interface for receiving control signals for said RF tuner, wherein said digital serial bus interface is physically located on said integrated circuit substrate.

50. The receiver of claim 31 wherein said all channels are at least all of the channels within the bandwidth of 55 MHZ to 806 MHZ.

51. The receiver of claim 31 wherein said amplifier and said first and second mixers are physically located on the same integrated circuit substrate.

52. The receiver of claim 51 wherein said first and second IF filters are physically located on said integrated circuit substrate.

53. The receiver of claim 51 wherein said first and second IF filters are not physically located on said integrated circuit substrate.

54. The receiver of claim 53 further comprising a frequency synthesizer for generating said first and second local oscillator signals, wherein said frequency synthesizer is physically located on said integrated circuit substrate.

55. The receiver of claim 54 further comprising a digital serial bus interface for receiving control signals for said receiver, wherein said digital serial bus interface is physically located on said integrated circuit substrate.

56. The receiver of claim 51 wherein only one of said first and second IF filters is physically located on said integrated circuit substrate.

57. A dual conversion RF tuner serving as the front end of a television receiver comprising:

a low noise amplifier passing all channels in a received television band;

a first mixer having a first input coupled to said low noise amplifier and a second input coupled to a first local oscillator signal, wherein said first mixer outputs a first IF signal;

a first IF filter coupled to said first mixer and providing coarse channel selection, wherein, said first IF filter removes all channels outside a selected frequency hand from said first IF signal;

a second mixer having a first input coupled to said first IF filter and a second input coupled to a second local oscillator signal; and a second IF filter coupled to said second mixer and providing fine channel selection, wherein said low noise amplifier, said first mixer and said second mixer are physically located on the same integrated circuit substrate, and wherein only one of said first and second IF filters is physically located on said integrated circuit substrate.

* * * * *